United States Patent [19]

Baranowski

[11] 4,073,561
[45] Feb. 14, 1978

[54] METHOD FOR FORMING A HEAT SINK AND CONNECTOR DEVICE AND THE PRODUCT THEREOF

[76] Inventor: Conrad J. Baranowski, 27 Elmore St., Arlington Heights, Mass. 02174

[21] Appl. No.: 743,153

[22] Filed: Nov. 18, 1976

[51] Int. Cl.² .......................................... H01R 13/00
[52] U.S. Cl. ................... 339/112 R; 29/629; 165/80; 174/DIG. 8; 174/16 R; 339/DIG. 1; 339/276 R
[58] Field of Search ............... 339/112 R, 17 C, 17 F, 339/124, 220 R, 221 R, 276 R, 30, DIG. 1, 95, 97 C; 174/DIG. 8, 16 R, 16 HS, 35 R, 35 TS, 52 PE; 165/80, 165, 183, 185; 29/3 C; 157.3 C; 357/80, 81

[56] References Cited

U.S. PATENT DOCUMENTS 2,175,036   10/1939   Sipe ............................ 339/276 R X
3,772,638   11/1973   Schoelles ..................... 339/276 R X
3,893,161    7/1975   Pesak, Jr. ....................... 174/16 HS

*Primary Examiner*—Roy Lake
*Assistant Examiner*—DeWalden W. Jones
*Attorney, Agent, or Firm*—James E. Mrose

[57] ABSTRACT

A heat sink and connection device for use with electrical leads and wires. A piece of tubing, large compared with the electrical lead to which it is to be connected, is formed with a diametrical hole through both sides of the tube wall. The lead is passed through both holes and the tube is then crimped, thereby forming 3-point contact with the lead and making positive electrical and physical connection therewith. The same concept may be used to join together two ends of wires or to connect a terminal clip or connector to a wire. The method of using the tubing to form the heat sink or connector is also disclosed.

4 Claims, 8 Drawing Figures

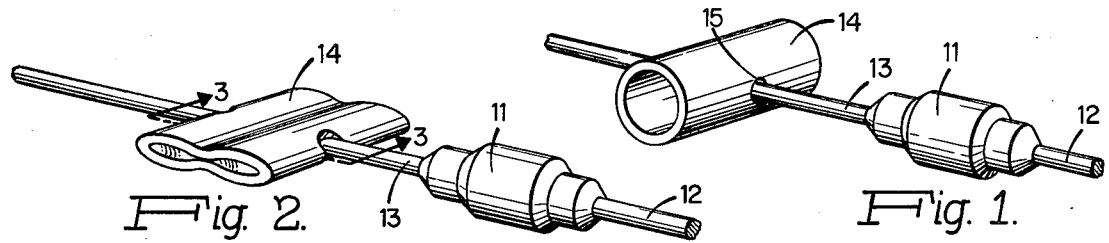
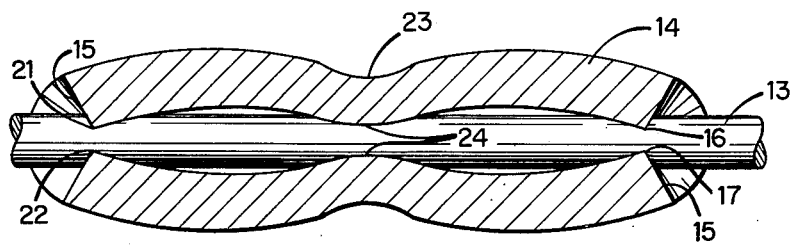
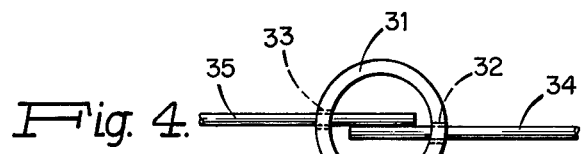
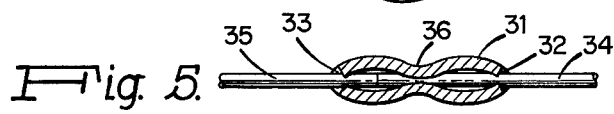
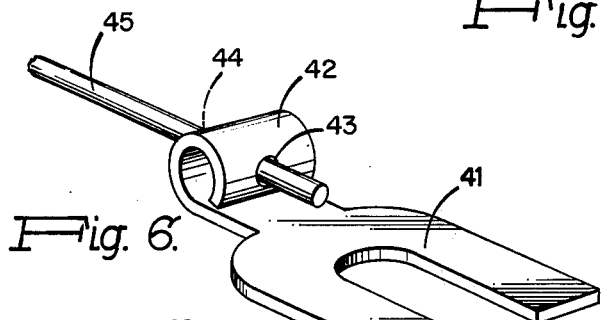
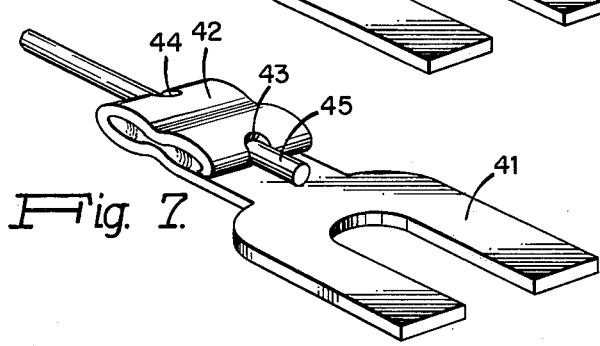
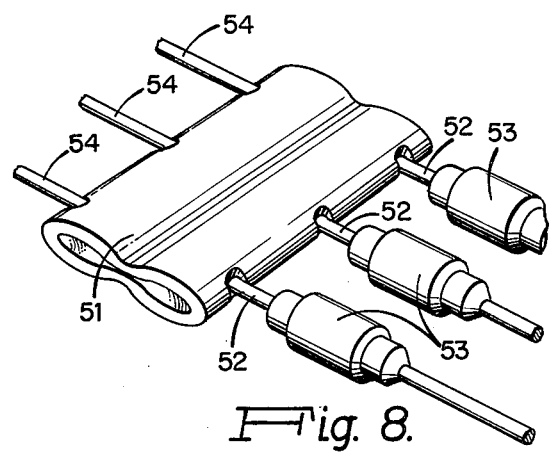

METHOD FOR FORMING A HEAT SINK AND CONNECTOR DEVICE AND THE PRODUCT THEREOF

FIELD OF THE INVENTION

This invention relates in general to electrical components and more particularly concerns a device which may be used as a heat sink and as a connector for electrical leads or wires and the method for forming the device.

DISCUSSION OF THE PRIOR ART

There are a very large number of different types and styles of heat sinks and means for connecting them to electronic components. One conventional way to connect a component to a heat sink is by means of a threaded connector such as shown in U.S. Pat. No. 3,777,238. Another common way of mounting a component to a heat sink is by means of bonding or soldering exemplified by U.S. Pat. Nos. 3,522,490, and 3,829,598. There are several examples of heat sinks which are spring loaded in making connection with the electronic component which generates the heat. Examples of this type device are described in U.S. Pat. Nos. 3,548,927, 3,893,161 and 3,566,958. Bending or crimping is also known in the prior art and two examples of this type of heat sink connector are shown in U.S. Pat. Nos. 3,694,703 and 3,387,653. Many of the devices disclosed in the above-mentioned patents are relatively complex and substantially all of them must be particularly formed for the purpose for which they are used. That is to say, common available materials are not used to form the connector or the heat sink.

SUMMARY OF THE INVENTION

The particular device of this invention is relatively simple, it does not require specific construction of a complex device and it can use readily available components to make a small but very effective heat sink. The heat sink of this invention consists of a segment of tubing, preferably copper, through which diametrical holes have been drilled. The electrical lead or wire is inserted through the holes in both sides of the tube and the tube is then crimped upon the lead. The inside edges of the diametrical holes bite into the surface of the lead and the center portion can provide a third contact if desired when crimped so that it presses upon the surface thereof.

This same concept may be applied to a device for joining adjacent ends of wires and may be used to apply a terminal or connector to the end of a piece of wire.

BRIEF DESCRIPTION OF THE DRAWING

The advantages, objects and features of this invention will be more clearly apparent from the following detailed description when taken in conjunction with the accompanying drawing in which:

FIG. 1 shows the heat sink of this invention coupled with the lead of an electronic component prior to the crimping step;

FIG. 2 shows the heat sink of FIG. 1 after it has been crimped to securely mount it to the lead of the component;

FIG. 3 is a greatly enlarged sectional view taken along cutting plane 3—3 of FIG. 2 showing the positive connection between the heat sink and the lead;

FIGS. 4 and 5 are similar to FIGS. 1 and 2 wherein the tubular device is used as a connector for coupling the ends of two wires together;

FIGS. 6 and 7 are similar to FIGS. 1 and 2 and disclose the concept of this invention used to mount a terminal slip to a wire; and FIG. 8 shows a typical usage of the heat sink of this invention connected to three electronic component leads.

DESCRIPTION OF THE PREFERRED EMBODIMENTS

With reference now to the drawing and more particularly to FIGS. 1-3 thereof, there is shown an electronic component such as a power semiconductor 11 having leads 12 and 13 extending from opposite ends thereof. A cylindrical or tubular member 14 is shown in FIG. 1 having a diametrical hole 15 formed in opposite portions of the side wall thereof. Lead 13 extends through hole 15 in both sides of the wall and in FIG. 2 the tubular segment 14 has been crimped so that it firmly and securely grips lead 13.

FIG. 3 shows how the edges 16, 17, 21 and 22 of holes 15 bite into the surface of lead 13. Furthermore, the center section 23 of tubular segment 14 is in positive contact with the wire at locations 24. The figure eight form shown in FIG. 3 may be achieved by applying opposing forces, longitudinal with respect to the tube, diametrically at the top and bottom of tubular segment 14, spaced by approximately 90° from holes 15. By applying substantial forces at these locations, the sides of the tube along its full length are forced inward to make contact with lead 13 and while this is being accomplished, the inside edges of holes 15 tilt inward toward each other and bite into the surface of the lead.

Several of the factors which determine the depth to which edges 16, 17, 21 and 22 bite into lead 13 are the diameter of hole 15, the thickness of tubing 14, the diameter of tubing 14 and the relative width of central portion 23 of the tubing which is forced toward the lead, that is, the final form of the crimped tubing. The degree of pinch, that is, the amount of bite into lead 13 incurred by the corners of holes 15, is inversely related to the size of hole 15. If the hole is approximately equal to the diameter of lead 13, the component lead will likely be pinched or cut off during the crimping process. If the hole is large compared with the diameter of the lead, there will likely not be any pinching action at all. Likewise, if the tubing thickness is greater than a predetermined value, the time at which pinch starts as the tube is crushed is sooner than if the thickness was less and if it is too thick, the lead may be pinched off in the same manner as if the hole were too small. Thus the degree of pinch is directly related to tubing wall thickness. Also, the diameter of the tubing is inversely related to the degree of pinch. The larger the tubing the more likely it will bow in the middle and exert less cutting action by the inside edges of holes 15 into the component lead. As the tubing diameter is made smaller, the geometry of the tubing dictates that less buckling of the tubing will occur and that more pinching of the component lead results. Finally, the distance and form to which the tubing is crushed will determine also to some extent the degree of pinch. If the tube is completely flattened, the component leads will likely be sheared off by the pinch at corners of hole 15. It is desirable that the tubing be pressed in the middle to provide the figure eight appearance shown in the drawing and to give a well defined middle third contact which helps to prevent the component from rotating within the heat sink connector device.

Typical examples of relative dimensions are that the size of hole 15 should be approximately two times the diameter of lead 13 and the thickness of tubing 14 should be approximately two times the diameter of lead 13. The outside diameter of tube 14 will preferably be in the vicinity of ten times the diameter of lead 13. Of course crimping forces should be applied to discrete areas of the tubing approximately 90° removed from holes 15 and should be only sufficient to close the middle of the tubing onto wire 12. It is possible under some circumstances that the tube will be crimped sufficiently to make the center contacts 24. In such cases the crimping forces will be applied only until a significant degree of pinch is accomplished at the inside edges of holes 15. The tube is preferably made of copper or some similar material which is an excellent conductor of heat or electricity or both. It will normally be quite massive compared with the lead to which it is crimped, will readily conduct heat away from the lead and conduct or radiate the heat to the surrounding environment.

With further reference to FIG. 3, it should be noted that lead 13 is placed in tension when tube 14 is crimped upon it. As soon as corners 16, 17, 21 and 22 firmly bite into the sides of lead 13, the distance between corners 16, 17 and corners 21 and 22 increases thereby stretching lead 13. By maintaining the lead in tension upon completion of the forming of the heat sink, a very positive contact results which prevents the lead from becoming loose or being permitted to rotate. Stresses could occur after the heat sink is formed from such factors as temperature changes. Such stresses could cause variations in the relative sizes of the respective elements to occur due to different thermal coefficients. By having the very positive contact between lead and heat sink as described herein, it is unlikely that such stresses would be sufficient to allow relative motion between these elements. Because of the very positive action of the corners of holes 15, the heat sink of this invention can make good electrical and thermal contact even through an insulated or enameled wire since corners 16, 17, 21 and 22 would cut through such coating.

The concept discussed in connection with FIGS. 1-3 applies equally to FIGS. 4 and 5 wherein a tube segment 31 having diametrical holes 32 and 33 is employed to join together the ends of two wires 34 and 35. Wire 34 extends from outside tube 31 through hole 32 into the interior thereof and wire 35 likewise extends into the interior through hole 33. As shown in FIG. 5, the wires are joined through connector 31 when it is crimped upon the two wires so that the corners of holes 32 and 33 bite into the wires in the manner previously discussed and central portion 36 also presses firmly against the wires at their common location. This device may or may not be a heat sink but it is a convenient means to mechanically couple together two wires in a permanent manner.

Another alternative embodiment is shown in FIGS. 6 and 7. A terminal clip or spade connector 41 is formed with a cylindrical segment or loop 42 in which holes 43 and 44 are formed. The end of a wire 45 passes through holes 43 and 44 and the same crimping action as previously discussed is accomplished so that the connector 41 is firmly mounted to wire 45 as shown in FIG. 7. The same 3-point contact results and the connector is firmly and positively mounted to the wire in the same manner as previously described.

FIG. 8 shows tubular segment 51 crimped in the manner previously discussed upon three leads 52 of semiconductors 53. The distal ends 54 of leads 52 may be severed adjacent the side of tubing 51 or one or more of them may be connected to a printed circuit board. Of course, this embodiment dictates that leads 52 be at a common potential.

It should be understood that "leads" and "wires" are interchangeable terms for purposes of this description. Further, the crimped cylindrical device of this invention may be used as an electrical common connector or bus bar, as shown in FIG. 8.

It is likely that in view of the description herein, modifications and other uses of this invention will occur to those skilled in the art which are within the scope of this invention.

What is claimed is:

1. A heat sink arrangement comprising:
   a substantially straight length of electrical lead material;
   a hollow thermally-conductive member having a single wall of uniform thickness forming an elongated figure eight cross section and having a pair of holes through opposite ends thereof in alignment with the direction of elongation of said figure eight cross section;
   said length of electrical lead material extending through said pair of holes with edges of said holes biting into opposing sides of said length of electrical lead material;
   the portions of said hollow member which form the central section of said figure eight cross section pressing against said length of electrical lead material from opposite sides thereof; and
   said thickness of said wall of said hollow member being approximately two times the thickness of said electrical lead material, and the mass of said hollow member being large compared with the mass of said length of electrical lead material enclosed within said hollow member.

2. The heat sink arrangement recited in claim 1 wherein said length of electrical lead material comprises wire of a predetermined diameter, wherein said thickness of said wall is approximately two times said diameter, and wherein the length of said conductive member in said direction of said elongation of said figure eight cross section is greater than 10 times the diameter of said wire.

3. A method for providing an electrical lead with a heat sink, said method comprising the steps of:
   boring a pair of holes of one predetermined diameter through the wall of a cylindrical tube of uniform-thickness conductive material at diametrically opposite positions;
   inserting through said pair of holes an electrical lead having a thickness approximately half the diameter of said holes; and
   crimping said tube upon said lead by applying force along opposite longitudinal surfaces of said tube at points spaced approximately 90° from said holes, whereby a figure eight cross section is imparted to said tube and the inner edges of said holes bite into said lead and the central portions of said wall are compressed upon said lead between said holes.

4. The method recited in claim 3 wherein said lead is a wire having a diameter equal to said thickness, wherein said boring is performed upon a tube having an outside diameter approximately ten times the diameter of said wire and a wall thickness approximately two times the diameter of said wire.

* * * * *